United States Patent
Zheng et al.

(10) Patent No.: US 8,067,265 B2
(45) Date of Patent: Nov. 29, 2011

(54) ELECTRIC DEVICES AND METHODS OF MANUFATURING THE SAME

(75) Inventors: Zi-Jian Zheng, Evanston, IL (US); Wilhelm Huck, Comberton (GB); Richard Friend, Cambridge (GB); Jonathan Halls, Cambridge (GB); Jeremy Burroughes, Cambridge (GB)

(73) Assignees: Cambridge Display Technology Limited, Cambridgeshire (GB); Cambridge Enterprises Ltd., Cambridgeshire (GB)

( * ) Notice: Subject to any disclaimer, the term of this patent is extended or adjusted under 35 U.S.C. 154(b) by 69 days.

(21) Appl. No.: 12/296,931

(22) PCT Filed: Apr. 4, 2007

(86) PCT No.: PCT/GB2007/001245
§ 371 (c)(1),
(2), (4) Date: May 15, 2009

(87) PCT Pub. No.: WO2007/128965
PCT Pub. Date: Nov. 15, 2007

(65) Prior Publication Data
US 2009/0321752 A1    Dec. 31, 2009

(30) Foreign Application Priority Data

Apr. 10, 2006 (GB) .................................. 0607193.0

(51) Int. Cl.
*H01L 51/40* (2006.01)
(52) U.S. Cl. ............... 438/99; 438/22; 438/82; 257/40

(58) Field of Classification Search ............... 257/40; 438/22, 82, 99
See application file for complete search history.

(56) References Cited

U.S. PATENT DOCUMENTS

| | | | |
|---|---|---|---|
| 2002/0098364 A1* | 7/2002 | Bernard et al. ............... | 428/447 |
| 2004/0086709 A1* | 5/2004 | Hammond Cunningham et al. ............... | 428/335 |
| 2004/0102050 A1* | 5/2004 | Delamarche et al. ......... | 438/734 |
| 2005/0142974 A1* | 6/2005 | Lee ............................... | 445/24 |
| 2005/0199584 A1* | 9/2005 | Nuzzo et al. .................... | 216/54 |
| 2006/0137554 A1* | 6/2006 | Kron et al. ................. | 101/463.1 |

FOREIGN PATENT DOCUMENTS

| | | |
|---|---|---|
| WO | WO 03/065474 A1 | 8/2003 |
| WO | WO 2004/055920 A2 | 7/2004 |
| WO | WO 2005/036509 A2 | 4/2005 |

OTHER PUBLICATIONS

Yoshihiro Koide, Matthew W. Such, Rajiv Basu, Guennadi Evmenenko, Ji Cui, Pulak Dutta, Mark C. Hersam, and Tobin J. Marks, Hot Microcontact Printing for Patterning ITO Surfaces. Methodology, Morphology, Microstructure, and OLED Charge Injection Barrier Imaging, Langmuir 2003 19 (1), 86-93.*

(Continued)

*Primary Examiner* — Kiesha Bryant
*Assistant Examiner* — Mark Tornow
(74) *Attorney, Agent, or Firm* — McDermott Will & Emery LLP

(57) ABSTRACT

A process for manufacturing an electrical device, the process comprising the steps: providing a substrate; bringing a stamp into contact with the substrate whereby areas of the substrate contacted by the stamp have decreased wettability; and depositing a liquid comprising an electrically active material over areas of the substrate located between the areas of decreased wettability.

55 Claims, 10 Drawing Sheets

OTHER PUBLICATIONS

Xue-Mei Li, Mária Péter, Jurriaan Huskens, and David N. Reinhoudt, Catalytic Microcontact Printing without Ink, Nano Letters 2003 3 (10), 1449-1453.*

C. R. Kagan, et al., "Patterning Organic—Inorganic Thin-film Transistors Using Microcontact Printed Templates," Applied Physics Letters, vol. 79, No. 21, pp. 3536-3538 (Nov. 19, 2001).

Alessandro Pozzato, et al., "Superhydrophobic Surfaces Fabricated by Nanoimprint Lithography," Microelectronic Engineering, vol. 83, No. 4-9, pp. 884-888 (Jan. 23, 2006).

Seung-Mo Lee, et al., "Fabrication of Hydrophobic Films Replicated From Plant Leaves in Nature," Surface & Coatings Technology, vol. 201, No. 3-4, pp. 553-559 (Jan. 19, 2006).

* cited by examiner

ELECTRIC DEVICES AND METHODS OF MANUFATURING THE SAME

FIELD OF INVENTION

This invention relates to electrical devices and methods of manufacturing the same. Embodiments of the present invention relate to opto-electrical devices, particularly organic light-emissive devices, and methods of manufacturing these devices. In particular, embodiments of the present invention relate to methods of manufacturing these types of devices using solution-processing techniques.

BACKGROUND OF INVENTION

One class of electrical devices is opto-electrical devices that use an organic material for light emission (or detection in the case of photovoltaic cells and the like). The basic structure of these devices is a light emissive organic layer, for instance a film of a poly (p-phenylenevinylene) ("PPV") or polyfluorene, sandwiched between a cathode for injecting negative charge carriers (electrons) and an anode for injecting positive charge carriers (holes) into the organic layer. The electrons and holes combine in the organic layer generating photons. In WO90/13148 the organic light-emissive material is a polymer. In U.S. Pat. No. 4,539,507 the organic light-emissive material is of the class known as small molecule materials, such as (8-hydroxyquinoline) aluminium ("Alq3"). In a practical device one of the electrodes is transparent, to allow the photons to escape the device.

A typical organic light-emissive device ("OLED") is fabricated on a glass or plastic substrate coated with a transparent anode such as indium-tin-oxide ("ITO"). A layer of a thin film of at least one electroluminescent organic material covers the first electrode. Finally, a cathode covers the layer of electroluminescent organic material. The cathode is typically a metal or alloy and may comprise a single layer, such as aluminium, or a plurality of layers such as calcium and aluminium.

In operation, holes are injected into the device through the anode and electrons are injected into the device through the cathode. The holes and electrons combine in the organic electroluminescent layer to form an exciton which then undergoes radiative decay to give light (in light detecting devices this process essentially runs in reverse).

OLEDs can provide a particularly advantageous form of electro-optic display. They are bright, colourful, fast-switching, provide a wide viewing angle and are easy and cheap to fabricate on a variety of substrates. Organic (which here includes organometallic) LEDs may be fabricated using either polymers or small molecules in a range of colours (or in multi-coloured displays), depending upon the materials used. A typical OLED device comprises two layers of organic material, one of which is a layer of light emitting material such as a light emitting polymer (LEP), oligomer, dendrimer or a light emitting low molecular weight material, and the other of which is a conductive polymer layer, for example a layer of a hole transporting material such as a polythiophene derivative or a polyaniline derivative.

Organic LEDs may be deposited on a substrate in a matrix of pixels to form a single or multi-colour pixellated display. A multicoloured display may be constructed using groups of red, green, and blue emitting pixels. So-called active matrix displays have a memory element, typically a storage capacitor and a transistor, associated with each pixel whilst passive matrix displays have no such memory element and instead are repetitively scanned to give the impression of a steady image.

A number of different methods have been used to deposit the organic materials including vapour deposition and solution processing techniques such as spin-coating and inkjet printing.

FIG. 1 shows a vertical cross section through an example of an OLED device 100. In an active matrix display, part of the area of a pixel is occupied by associated drive circuitry (not shown in FIG. 1). The structure of the device is somewhat simplified for the purposes of illustration.

The OLED 100 comprises a substrate 102, typically 0.7 mm or 1.1 mm glass but optionally clear plastic, on which an anode layer 106 has been deposited. The anode layer typically comprises around 150 nm thickness of ITO (indium tin oxide), over which is provided a metal contact layer, typically around 500 nm of aluminium, sometimes referred to as anode metal. Glass substrates coated with ITO and contact metal may be purchased from Corning, USA. The contact metal (and optionally the ITO) is patterned as desired so that it does not obscure the display, by a conventional process of photolithography followed by etching.

An optional, substantially transparent hole transport layer 108a is provided over the anode metal, followed by an electroluminescent layer 108b. Banks 112 may be formed on the substrate, for example from positive or negative photoresist material, to define wells 114 into which these active organic layers may be selectively deposited, for example by a droplet deposition or inkjet printing technique. The wells thus define light emitting areas or pixels of the display.

A cathode layer 110 is then applied by, say, physical vapour deposition. The cathode layer typically comprises a low work function metal such as calcium or barium covered with a thicker, capping layer of aluminium and optionally including an additional layer immediately adjacent the electroluminescent layer, such as a layer of lithium fluoride, for improved electron energy level matching. In the case of a passive matrix device, mutual electrical isolation of cathode lines may be achieved through the use of cathode separators (element 302 of FIG. 3b). Typically a number of displays are fabricated on a single substrate and at the end of the fabrication process the substrate is scribed, and the displays separated. An encapsulant such as a glass sheet or a metal can is utilized to inhibit oxidation and moisture ingress.

In the case of a polymer-based OLED, layers 108 comprise a hole transport layer 108a and a light emitting polymer (LEP) electroluminescent layer 108b. The electroluminescent layer may comprise, for example, around 70 nm (dry) thickness of PPV (poly(p-phenylenevinylene)) and the hole transport layer, which helps match the hole energy levels of the anode layer and of the electroluminescent layer, may comprise, for example, around 50-200 nm, preferably around 150 nm (dry) thickness of PEDOT:PSS (polystyrene-sulphonate-doped polyethylene-dioxythiophene).

FIG. 2 shows a view from above (that is, not through the substrate) of a portion of a three-colour active matrix pixellated OLED display 200 after deposition of one of the active colour layers. The figure shows an array of banks 112 and wells 114 defining pixels of the display.

FIG. 3a shows a view from above of a substrate 300 for inkjet printing a passive matrix OLED display. FIG. 3b shows a cross-section through the substrate of FIG. 3a along line Y-Y'.

Referring to FIGS. 3a and 3b, in the case of a passive matrix display the substrate is provided with a plurality of cathode undercut separators 302 to separate adjacent cathode lines (which will be deposited in regions 304). A plurality of wells 308 are defined by banks 310, constructed around the perimeter of each well 308 and leaving an anode layer 306 exposed at the base of the well. The banks present a hydrophobic surface in order that they are not wetted by the solution of deposited organic material and thus assist in containing the deposited material within a well. This is achieved by treatment of a bank material such as polyimide with an $O_2/CF_4$ plasma as disclosed in EP 0989778. Alternatively, the plasma treatment step may be avoided by use of a fluorinated material such as a fluorinated polyimide as disclosed in WO 03/083960. It will be appreciated that cathode undercut separators are not necessary in the case of an active matrix display, for example, in which case any given pixel is activated by means of a transistor associated with said pixel.

As previously mentioned, the bank and (where present) separator structures may be formed from resist material, for example using a positive (or negative) resist for the banks and a negative (or positive) resist for the separators; both these resists may be based upon polyimide and spin coated onto the substrate, or a fluorinated or fluorinated-like photoresist may be employed. In the example shown the cathode separators are around 5 µm in height and approximately 20 µm wide. Banks are generally between 20 µm and 100 µm in width and in the example shown have a 4 µm taper at each edge (so that the banks are around 1 µm in height). The pixels of FIG. 3a are approximately 300 µm square but the size of a pixel can vary considerably, depending upon the intended application.

The deposition of material for organic light emitting diodes (OLEDs) using ink jet printing techniques are described in a number of documents including, for example: T. R. Hebner, C. C. Wu, D. Marcy, M. H. Lu and J. C. Sturm, "Ink-jet Printing of doped Polymers for Organic Light Emitting Devices", *Applied Physics Letters*, Vol. 72, No. 5, pp. 519-521, 1998; Y. Yang, "Review of Recent Progress on Polymer Electroluminescent Devices," *SPIE Photonics West: Optoelectronics '98*, Conf. 3279, San Jose, January, 1998; EP 0 880 303; and "Ink-Jet Printing of Polymer Light-Emitting Devices", Paul C. Duineveld, Margreet M. de Kok, Michael Buechel, Aad H. Sempel, Kees A. H. Mutsaers, Peter van de Weijer, Ivo G. J. Camps, Ton J. M. van den Biggelaar, Jan-Eric J. M. Rubingh and Eliav I. Haskal, Organic Light-Emitting Materials and Devices V, Zakya H. Kafafi, Editor, Proceedings of SPIE Vol. 4464 (2002). Ink jet techniques can be used to deposit materials for both small molecule and polymer LEDs.

Inkjet printing has many advantages for the deposition of materials for molecular electronic devices but there are also some drawbacks associated with the technique. It has been found that dissolved molecular electronic material deposited into a well with shallow edges dries to form a film with a relatively thin edge. FIGS. 4a and 4b illustrate this process.

FIG. 4a shows a simplified cross section 400 through a well 308 filled with dissolved material 402, and FIG. 4b shows the same well after the material has dried to form a solid film 404. In this example the bank angle is approximately 15° and the bank height is approximately 1.5 µm. As can be seen a well is generally filled until it is brimming over. The solution 402 has a contact angle $\theta_c$ with the plasma treated bank material of typically between 30° and 40° for example around 35°; this is the angle the surface of the dissolved material 402 makes with the (bank) material it contacts, for example angle 402a in FIG. 4a. As the solvent evaporates the solution becomes more concentrated and the surface of the solution moves down the tapering face of a bank towards the substrate; pinning of the drying edge can occur at a point between the initially landed wet edge and the foot of the bank (base of the well) on the substrate. The result, shown in FIG. 4b, is that the film of dry material 404 can be very thin, for example of the order of 10 nm or less, in a region 404a where it meets the face of a bank.

In practice drying is complicated by other effects such as the coffee ring-effect. With this effect because the thickness of solution is less at the edge of a drop than in the centre, as the edge dries the concentration of dissolved material there increases. Because the edge tends to be pinned solution then flows from the centre of the drop towards the edge to reduce the concentration gradient. This effect can result in dissolved material tending to be deposited in a ring rather than uniformly. The physics of the interactions of a drying solution with a surface are extremely complicated and a complete theory still awaits development.

A further problem with inkjet deposition arises when filling wells which are large compared with the size of an inkjet droplet. A typical droplet from an inkjet print head has a diameter of approximately of 30 µm in flight and the droplet grows to approximately 100 µm in diameter when it lands and wets out. However it is difficult to produce drops of, say 100 µm in diameter (in flight) from a print head.

Filling a well or pixel of a similar size to a drop presents little problem as when the drop lands it spreads out and fills the well. This is illustrated in FIG. 5a which shows a well 500 for a long thin pixel of a type which is typically used in a RGB (red green blue) display. In the example of FIG. 5a the pixel has a width of 50 µm and a length of 150 µm with 20 µm wide banks (giving a 70 µm pixel pitch and a 210 µm full colour pitch). Such a well can be filled by three 50 µm droplets 502a, b, c as shown. Referring now to FIG. 5b this shows a well 510 for a pixel which is approximately four times larger than each dimension giving a pixel width of approximately 200 µm, more suitable for applications such as a colour television. As can be seen from the figure, many droplets 512 are needed to fill such a pixel. In practice, these tend to coalesce to form a larger droplet 514 which tends not to properly fill corners of the pixel (although FIGS. 5a and 5b and idealised and, in practice, the corners are not generally as sharp as they are shown). One way around this problem is to over fill the well to an extent that the dissolved material is pushed into the corners. This can be achieved by using a large number of dilute droplets and a high barrier around the well. Techniques for depositing large volumes of liquid are described in WO03/065474, which describes the use of very high barriers (for examples at page 8 lines 8 to 20) to allow the wells to hold a large volume of liquid without the liquid overflowing to adjacent wells. However such structures cannot easily be formed by photolithography and instead a plastic substrate is embossed or injection moulded. It is also desirable to be able to fill a well using fewer (higher concentration) droplets as this enables, inter alia faster printing.

Another problem associated with ink jet printing of organic opto-electrical devices such as those discussed above is that in the resultant device, the organic hole injecting layer can extend beyond the overlying organic semi-conductive layer providing a shorting path between the cathode and the anode at an edge of the well. By shorting path, we mean a path through which current flows in preference to flowing through the light emissive material. This problem is exacerbated if the contact angle of the conductive organic composition with the bank material is too low. This problem is further exacerbated if the conductivity of the organic hole injecting layer is too high.

One solution to the aforementioned problem is to modify the bank structure by, for example, providing a stepped bank structure which increases the length of the shorting path, thus increasing the resistance of the path resulting in less shorting. Such a solution has been proposed by Seiko Epson. However, providing a more complex bank structure is expensive and increases the complexity of the manufacturing method for the device.

Embodiments of the present invention seek to solve the aforementioned problems. In particular, embodiments of the present invention seek to solve the problems associated with containing solution processed electrically active material within wells defined by banks, ensure that the wells are completely wetted-out by the solution, and solve the problems associated with non-uniform film formation and shorting. Embodiments of the present invention seek to solve these problems while providing a simple and inexpensive manufacturing method.

SUMMARY OF THE PRESENT INVENTION

According to a first aspect of the present invention there is provided a process for manufacturing an electrical device, the process comprising the steps: providing a substrate; bringing a stamp into contact with the substrate whereby areas of the substrate contacted by the stamp have decreased wettability; and depositing a liquid comprising an electrically active material over areas of the substrate located between the areas of decreased wettability.

In one embodiment, the process involves stamping the substrate prior to deposition of a hole injecting layer, preferably a conducting polymer, more preferably PEDOT doped with a suitable counter ion, most preferably PEDOT:PSS.

Preferably, the process comprises the steps: providing a substrate comprising a bank structure defining one or more wells; bringing a stamp into contact with a distal surface of the bank structure whereby the wettability of the distal surface of the bank structure is decreased; and depositing a liquid comprising an electrically active material into the one or more wells.

When no bank structure is provided, it is preferably to use an indiscriminate/untargeted deposition technique such as spin coating or dip-coating, most preferably spin coating. When a bank structure is provided a targeted deposition technique such as ink-jet printing is preferred.

The aforementioned process provides a simple and low cost method of ensuring that the electrically active material remains within the one or more wells when it is deposited. Because the wettability of the distal surface of the bank structure is decreased, liquid deposited in a well is prevented from flowing over the bank structure into adjacent wells.

Furthermore, if liquid is deposited on the distal surface of the bank structure it tends to flow off due to the low wettability of these surfaces ensuring that the deposited electrically active material is located in the wells rather than on the bank structure. As such, the process allows accurate positioning of the electrically active material on the substrate, even when the deposition step is not performed to a high degree of accuracy. Such an arrangement allows for a simple and low cost method of patterning electrically active material on a substrate to high accuracy.

The present invention allows more electrically active material to be deposited into a well without the material flowing over the bank structure into adjacent wells. As such, it can be ensured that the wells are completely wetted-out without flooding the wells. This can also alleviate problems with shorting as enough material can be deposited so as to ensure that an underlying layer is completely covered.

Embodiments of the present invention can also provide a more uniform film within each well by allowing more material to be deposited in each well. Furthermore, as the present method allows the distal surface of the bank structure to be decreased in wettability separately from the side walls of the bank structure, then the side walls can be made more or less wettable as desired for uniform film formation within each well by selecting a suitable bank material for this purpose, while still ensuring that the material deposited into the wells will remain therein. The present invention thus allows for more freedom in selecting bank materials.

The aforementioned advantageous features are achieved without requiring complicated bank structures and/or complex formulations of the liquid containing the electrically active material. As such, embodiments of the present invention solve the problems in prior art arrangements while providing a simple and inexpensive manufacturing method.

It is to be understood that the term "wells" is not limited to a particular shape. For example, the wells may be elongate like troughs or valleys, e.g. to define lines of a circuit and in which conductive material is deposited to form the circuit. Alternatively, the wells may be discrete point like regions, e.g. to define pixels/sub-pixels of a display in which light-emissive material is deposited.

The bank structure may be formed by a lithographic process such as photolithography. Lithographic processes are relatively simple for forming a single patterned layer of bank material. However, the process becomes more complicated if multiple layers are required to be lithographically patterned such as in some of the prior art arrangements which provide a double bank structure. Embodiments of the present invention provide the functional benefits of such double bank structures while avoiding the need for a plurality of lithographically patterned layers. Furthermore, embodiments of the present invention have the advantage over double bank structures in that the structures of the present invention can be made thinner for producing very thin devices.

The substrate may comprise an electrode layer forming a bottom of the wells, preferably an anode. The process may further comprise the step of depositing an electrode layer over the electrically active material, preferably a cathode. Such an arrangement can be utilised in light-emissive displays, photovoltaic cells, diodes and transistors.

Preferably, the electrically active material is organic. The organic material may comprise one or more of a polymer, an oligomer, a dendrimer and a low molecular weight material. The electrically active material may comprise a light-emissive material. The electrically active material may comprise a semi-conductive material. The electrically active material may alternatively or additionally comprise a conductive material. A plurality of electrically active materials may be deposited in the deposition step. These may be deposited as a blend. A plurality of electrically active layers may be deposited. In a particularly preferred arrangement, a hole injecting layer of a conductive material, a hole transport layer of a semiconductive organic material, and a light-emissive layer are deposited.

The hole injecting material may be formed of an organic or inorganic hole injecting material. An example of an organic hole injecting material is PEDOT (polyethylene-dioxythiophene) doped with a suitable anion, in particular a polyanion, for example PEDOT:PSS.

The light emissive layer may consist of the electroluminescent material alone or may comprise the electroluminescent material in combination with one or more further materials. In particular, the electroluminescent material may be blended with hole and/or electron transporting materials as disclosed in, for example, WO 99/48160. Alternatively, the electroluminescent material may be covalently bound to a charge transporting material.

Suitable electroluminescent materials for use in the light-emissive layer include poly(arylene vinylenes) such as poly(p-phenylene vinylenes) and as disclosed in, for example, Adv. Mater. 2000 12(23) 1737-1750 and references therein such as: polyarylenes, in particular alkyl or alkoxy substituted 1,4-phenylene repeat units as disclosed in J. Appl. Phys. 1996, 79, 934; optionally substituted polyfluorenes, particularly 2,7-linked 9,9 dialkyl polyfluorenes as disclosed in EP 0842208 or 2,7-linked 9,9 diaryl polyfluorenes; polyspirobifluorenes as disclosed in, for example EP 0707020, particularly 2,7-linked poly-9,9-spirobifluorenes; and polyindenofluorenes, particularly 2,7-linked polyindenofluorenes as disclosed in Macromolecules 2000, 33(6), 2016-2020. Examples of substituents for the aforementioned arylene units include solubilising groups such as $C_{1-20}$ alkyl or alkoxy; electron withdrawing groups such as fluorine, nitro or cyano; and substituents for increasing glass transition temperature (Tg) of the polymer.

Particularly preferred polymers comprise optionally substituted, 2,7-linked fluorenes, most preferably repeat units of formula VIII:

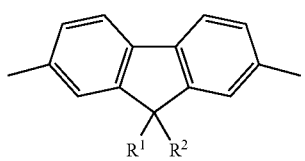

(VIII)

wherein $R^1$ and $R^2$ are independently selected from hydrogen or a substituent, preferably a substituent selected from the group consisting of alkyl, alkoxy, aryl, arylalkyl, heteroaryl and heteroarylalkyl. More preferably, at least one of $R^1$ and $R^2$ comprises an optionally substituted $C_4$-$C_{20}$ alkyl or aryl group.

Preferably, the polymer is a copolymer comprising at least one type of first repeat unit selected from optionally substituted arylenes as described above and one or more co-repeat units that may provide one or more of the functions of hole transport, electron transport and emission depending on which layer of the device it is used in and the nature of co-repeat units.

In particular:

a homopolymer of the first repeat unit, such as a homopolymer of 9,9-dialkylfluoren-2,7-diyl, may be utilised to provide electron transport.

a copolymer comprising a first repeat unit and a triarylamine repeat unit, in particular a repeat unit selected from formulae 1-6, may be utilised to provide hole transport and/or emission:

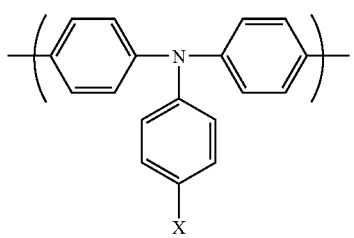

1

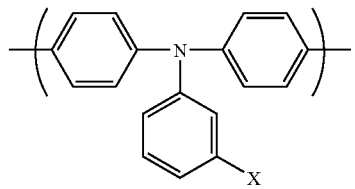

2

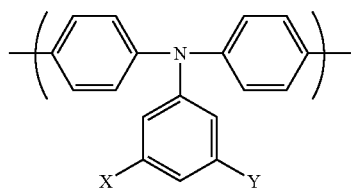

3

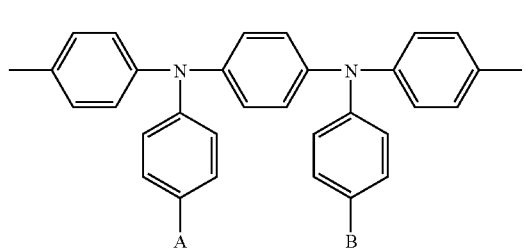

4

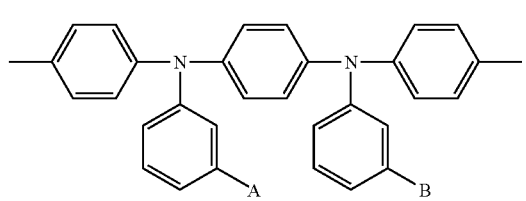

5

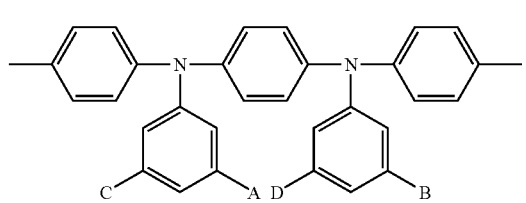

6 wherein X, Y, A, B, C and D are independently selected from H or a substituent group. More preferably, one or more of X, Y, A, B, C and D is independently selected from the group consisting of optionally substituted, branched or linear alkyl, aryl, perfluoroalkyl, thioalkyl, cyano, alkoxy, heteroaryl, alkylaryl and arylalkyl groups. Most preferably, X, Y, A and B are $C_{1-10}$ alkyl. The aromatic rings in the backbone of the polymer may be linked by a direct bond or a bridging group or bridging atom, in particular a bridging heteroatom such as oxygen.

a copolymer comprising a first repeat unit and heteroarylene repeat unit may be utilised for charge transport or emission. Preferred heteroarylene repeat units are selected from formulae 7-21:

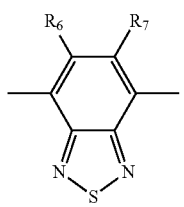
wherein $R_6$ and $R_7$ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R_6$ and $R_7$ are preferably the same. More preferably, they are the same and are each a phenyl group.
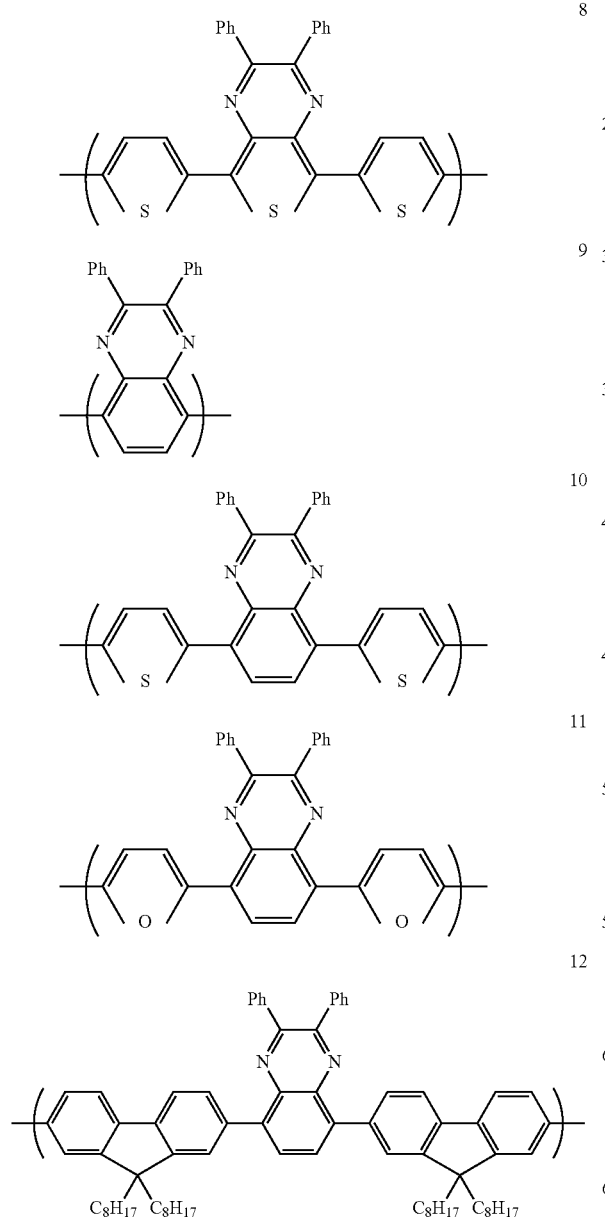
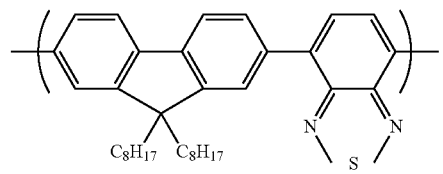
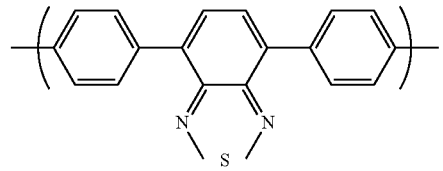
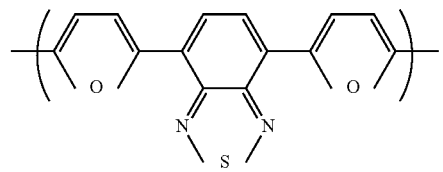
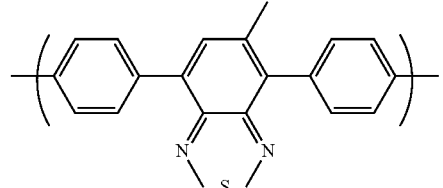
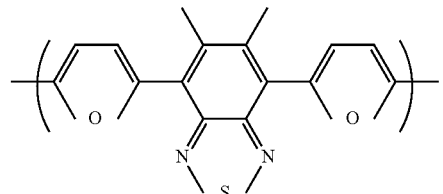
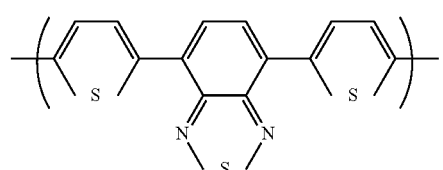
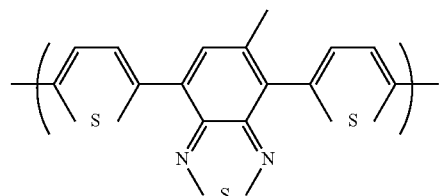
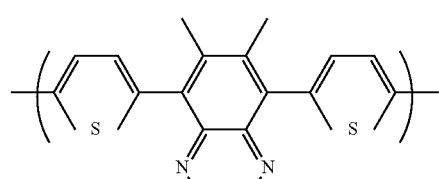

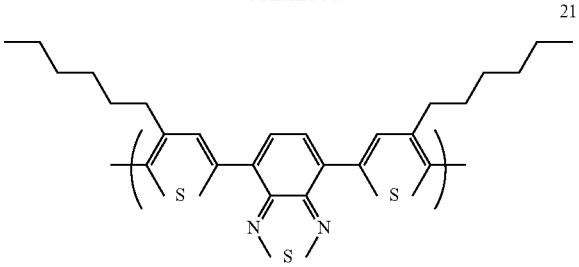

Electroluminescent copolymers may comprise an electroluminescent region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality.

The different regions within such a polymer may be provided along the polymer backbone, as per U.S. Pat. No. 6,353,083, or as groups pendant from the polymer backbone as per WO 01/62869.

Preferred methods for preparation of these polymers are Suzuki polymerisation as described in, for example, WO 00/53656 and Yamamoto polymerisation as described in, for example, T. Yamamoto, "Electrically Conducting And Thermally Stable π—Conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

By "red electroluminescent material" is meant an organic material that by electroluminescence emits radiation having a wavelength in the range of 600-750 nm, preferably 600-700 nm, more preferably 610-650 nm and most preferably having an emission peak around 650-660 nm.

By "green electroluminescent material" is meant an organic material that by electroluminescence emits radiation having a wavelength in the range of 510-580 nm, preferably 510-570 nm.

By "blue electroluminescent material" is meant an organic material that by electroluminescence emits radiation having a wavelength in the range of 400-500 nm, more preferably 430-500 nm.

The light emitting layer may comprise a host material and a fluorescent or phosphorescent light emitting species provided as a dopant. Particularly preferred dopants are phosphorescent emitters.

Numerous hosts are described in the prior art for phosphorescent emitters including "small molecule" hosts such as 4,4'-bis(carbazol-9-yl)biphenyl), known as CBP, and (4,4',4''-tris(carbazol-9-yl)triphenylamine), known as TCTA, disclosed in Ikai et al. (Appl. Phys. Lett., 79 no. 2, 2001, 156); and triarylamines such as tris-4-(N-3-methylphenyl-N-phenyl)phenylamine, known as MTDATA. Polymers are also known as hosts, in particular homopolymers such as poly (vinyl carbazole) disclosed in, for example, Appl. Phys. Lett. 2000, 77(15), 2280; polyfluorenes in Synth. Met. 2001, 116, 379, Phys. Rev. B 2001, 63, 235206 and Appl. Phys. Lett. 2003, 82(7), 1006; poly[4-(N-4-vinylbenzyloxyethyl, N-methylamino)-N-(2,5-di-tert-butylphenyl)napthalimide] in Adv. Mater. 1999, 11(4), 285; and poly(para-phenylenes) in J. Mater. Chem. 2003, 13, 50-55. Copolymers are also known as hosts.

The emitting species may be a metal complex. Preferred metal complexes comprise optionally substituted complexes of formula (V):

$$ML^1_qL^2_rL^3_s \qquad (V)$$

wherein M is a metal; each of $L^1$, $L^2$ and $L^3$ is a coordinating group; q is an integer; r and s are each independently 0 or an integer; and the sum of $(a.q)+(b.r)+(c.s)$ is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet states (phosphorescence). Suitable heavy metals M include:
  lanthanide metals such as cerium, samarium, europium, terbium, dysprosium, thulium, erbium and neodymium; and
  d-block metals, in particular those in rows 2 and 3 i.e. elements 39 to 48 and 72 to 80, in particular ruthenium, rhodium, palladium, rhenium, osmium, iridium, platinum and gold.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission colour is determined by the choice of the metal. The sharp emission is generally narrow, resulting in a pure colour emission useful for display applications.

The d-block metals form organometallic complexes with carbon or nitrogen donors such as porphyrin or bidentate ligands of formula (VI):

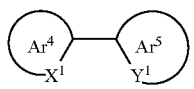

(VI)

wherein $Ar^4$ and $Ar^5$ may be the same or different and are independently selected from optionally substituted aryl or heteroaryl; $X^1$ and $Y^1$ may be the same or different and are independently selected from carbon or nitrogen; and $Ar^4$ and $Ar^5$ may be fused together. Ligands wherein $X^1$ is carbon and $Y^1$ is nitrogen are particularly preferred.

Examples of bidentate ligands are illustrated below:

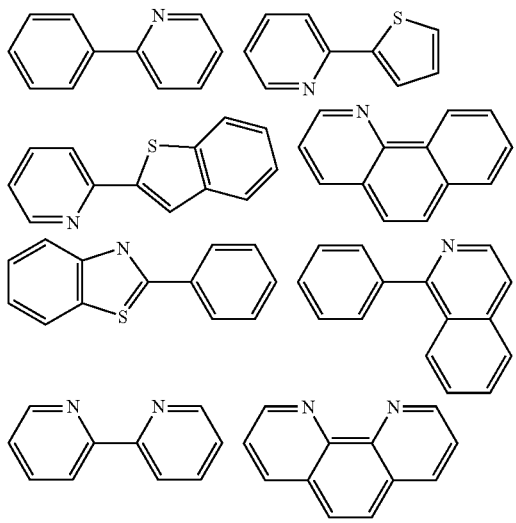

Each of $Ar^4$ and $Ar^5$ may carry one or more substituents. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed in WO 02/66552.

Other ligands suitable for use with d-block elements include diketonates, in particular acetylacetonate (acac); triarylphosphines and pyridine, each of which may be substituted.

Main group metal complexes show ligand based, or charge transfer emission. For these complexes, the emission colour is determined by the choice of ligand as well as the metal.

The host material and metal complex may be combined in the form of a physical blend. Alternatively, the metal complex may be chemically bound to the host material. In the case of a polymeric host, the metal complex may be chemically bound as a substituent attached to the polymer backbone, incorporated as a repeat unit in the polymer backbone or provided as an end-group of the polymer as disclosed in, for example, EP 1245659, WO 02/31896, WO 03/18653 and WO 03/22908.

A wide range of fluorescent low molecular weight metal complexes are known and have been demonstrated in organic light emitting devices [see, e.g., Macromol. Sym. 125 (1997) 1-48, U.S. Pat. Nos. 5,150,006, 6,083,634 and 5,432,014], in particular tris-(8-hydroxyquinoline)aluminium. Suitable ligands for di or trivalent metals include: oxinoids, e.g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (III), schiff bases, azoindoles, chromone derivatives, 3-hydroxyflavone, and carboxylic acids such as salicylato amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission colour.

Preferably, the electrically active material is deposited by inkjet printing. The inkjet printing process may involve aligning a printhead with a well and depositing electrically active material therein. Suitable solvents for the electrically active material will be known to the skilled person. For example, PEDOT may be deposited from an aqueous formulation, optionally containing additives to modify the conductivity of the PEDOT film, and solvents for semiconducting materials such as polyfluorenes include mono- or poly-alkylated benzenes, for example xylene and toluene.

The electrically active material may be deposited such that the material floods the wells and on drying the material flows into the wells off the projections due to the low wettability of the distal surface of the bank material in a flood printing process. The present invention thus allows a less accurate method of printing to be used. Instead of aligning a printhead with a well, the patterned substrate can be indiscriminately flooded with the liquid comprising the electrically active material. On drying, the material flows into the wells due to the low wettability of the distal surface of the bank structure.

The wettability of the distal surface of the bank structure may be altered by chemical and/or physical modification on contacting with the stamp. For example, material may be transferred from the stamp to the distal surface of the bank structure to alter the chemical nature of the distal surface of the projections. Alternatively, or additionally, the distal surface of the bank structure may be modified by roughening these surfaces by contacting with the stamp to reduce their wettability.

By roughening, we mean imparting a random or patterned unevenness to the distal surface of the bank structure whereby the distal surface comprises a plurality microscopic or nano-scale projections which reduce the wettability of the distal surface. For example, material may be transferred from the stamp to the distal surface of the bank structure so as to form the roughened surface if the material is not transferred as a continuous flat layer but rather is transferred so as to form a plurality of microscopic or nano-scale projections on the distal surface of the bank structure.

The bank structure can then be thought of as being comprised of two patterns: a first pattern defining the wells which may be formed by, for example, photolithography; and a second pattern which is formed on the distal surface of the bank structure by contacting with the stamp and which provides a low-wettability surface.

Preferably, the bank structure has a height in the range 0.1 to 5 μm, more preferably 0.5 to 3 μm, and most preferably in the range 1 to 1.5 µm. The distance between the wells may be in the range 20 to 100 µm and the wells may by approximately 100 to 500 µm wide. These well dimensions are suitable for defining pixels of a light-emissive display, although the size of a pixel can vary considerably depending on the intended application. Embodiments of the present invention may be used, for example, where the pixel is of micron or submicron scale.

Preferably, the distal surface of the bank structure is roughened such that it comprises a plurality of projections thereon, the projections having a height in the range 10 to 500 nm, more preferably 50 to 500 nm, more preferably still 100 to 300 nm. Preferably, the projections have a width in the range 0.1 to 10 µm, more preferably 0.5 to 5 µm, most preferably 1 to 2 µm. The distance between the projections is preferably in the range 0.1 to 10 µm, more preferably 0.5 to 5 µm, most preferably 1 to 2 µm. If the projections are too small in height then the aspect ratio (the ratio of the height to the width of the projections) is insufficient to decrease the wettability of the distal surface of the bank structure.

Preferably, the distal surface of the bank structure is made super de-wetting (or super hydrophobic). Such a surface exhibits "the lotus leaf effect" whereby drops of liquid deposited on the surface roll off the surface rather than wetting the surface. This effect occurs when the contact angle of the liquid on the surface is above 120°, preferably above 130°, more preferably above 140° and most preferably around 150° or higher. Such a surface may be unachievable by mere chemical alteration and may require a roughened surface as previously described.

Preferably, the stamp is made of an elastomeric material. This ensures good contact between the stamp and the distal surface of the bank structure. Most preferably, the stamp comprises PDMS (Poly Dimethyl Siloxane).

Preferably, prior to contacting the stamp with the substrate, the stamp is activated with a base or a fluoride such as ammonium fluoride. A base has been found to be most preferable, in particular, a hydroxide such as NaOH or KOH as fluorides can decompose the stamp too much preventing uniform transfer of material. It has been found that hydroxides are particularly effective at decomposing the stamp sufficiently to allow a good thick film of material to be transferred to the bank structure with a relatively short transfer period. The activation method according to this embodiment of the invention avoids high energy activation such as UVO activation used in the prior art. Preferably, the concentration of the activation solution is 1 mM to 100 mM. Concentrations within this range are enough to initiate decomposition of the material of the stamp but are not so strong as to cause severe damage to the stamp preventing uniform transfer of material.

After activation, the stamp is preferably brought into contact with the distal surface of the bank structure, baked, and the stamp peeled off. The baking step is preferably at a temperature in the range 40 to 90°, more preferably, 50 to 80°, most preferably about 65°. Preferably the stamp is treated with $O_2$ plasma prior to activation.

In one embodiment the electrical device is an organic light-emissive display formed by providing a substrate comprising a first electrode layer and a bank structure thereover defining one or more wells; bringing a stamp into contact with a distal surface of the bank structure wherein the wettability of the distal surface of the bank structure is decreased; depositing a liquid comprising a light-emissive material into the wells thereby forming a light-emissive layer; and depositing a second electrode over the light-emissive layer.

Preferably, a hole injecting material and/or a hole transporting material are deposited into the one or more wells prior to deposition of the light-emissive material. Cathode separators may be provided on the bank structure.

Electrical devices according to embodiments of the present invention can be thought of as being comprised of two patterns: a first pattern defining the wells which may be formed by, for example, photolithography; and a second pattern disposed between the wells and which provides a low-wettability surface. According to the above-described aspect of the present invention, the first pattern which defines the wells is provided by the bank structure formed by, for example, photolithography. The second pattern is formed on the distal surface of the bank structure by contacting with the stamp to provide the low-wettability surface disposed between the wells. However, according to an alternative aspect of the present invention, both the first and second patterns can be formed by the stamp, without the need for a bank structure.

According to the alternative aspect of the present invention there is provided a process comprising the steps: providing a substrate; bringing a stamp into contact with the substrate, the stamp comprising a bank structure defining one or more wells, the bank structure comprising a roughened distal surface whereby when the stamp is brought into contact with the substrate, areas of the substrate contacted by the roughened distal surface of the stamp have decreased wettability; and depositing a liquid comprising an electrically active material into areas of the substrate located between the areas of decreased wettability.

This aspect of the present invention utilizes a dual patterning concept as discussed above in relation to the first aspect. However, instead of providing the first pattern (defining the wells) on the substrate and forming the second pattern (the roughened surface) using the stamp, both patterns are formed using the stamp. Preferably, the first pattern and the second pattern have similar structural properties to those discussed in relation to the first aspect. The second pattern allows super de-wetting areas to be provided on the substrate and the first pattern allows these areas to be in defined locations on the substrate. Such an arrangement negates the requirement for a bank structure on the substrate and can thus be useful for producing very thin electrical devices. The features discussed in relation to the first aspect of the invention can be utilized in combination with this alternative aspect of the present invention.

According to another aspect of the present invention there is provided an electrical device comprising: a substrate comprising a low-wettability roughened surface defining a pattern; and a layer of electrically active material disposed over the substrate in areas between the low-wettability roughened surface.

Preferably, the substrate comprises a bank structure defining one or more wells, a distal surface of the bank, structure comprising the low-wettability roughened surface, and the layer of electrically active material being disposed in the one or more wells.

BRIEF SUMMARY OF THE DRAWINGS

Embodiments of the present invention will now be described, by way of example only, with reference to the accompanying drawings in which.

DETAILED DESCRIPTION OF PREFERRED EMBODIMENTS

Embodiments of the present invention relate to the fabrication of substrates with local control over wettability of topographically structured surfaces. This is of crucial importance in new microelectronic fabrication processes such as ink-jet printing, where ink diffusion due to 'overfilling' dramatically decreases the printing resolution. Here, a soft-lithographic method is described based on transferring PDMS patterns onto planar or topographically patterned substrates. The advantages of this procedure are substrate-tolerance (i.e. the method can be applied on Si wafers, glass, gold, and also on 'soft' surfaces like polymers and photo-resists) and spatial control over the wettability of non-planar surfaces. As demonstrated below, the creation of a two-tier hydrophilic-hydrophobic structure provides a simple and effective method for the selective wetting of the inside of lithographically prepared channels.

PDMS stamps were prepared as follows: Prepolymer Sylgard 184 (Dow Corning) and it's curing agent were mixed in a ratio of 10:1 and then cast on a photo-resist master patterned by photolithography (or other lithographic technique). After cured at 65° for 24 h, the PDMS stamp was peeled off from the master.

Figure 6:
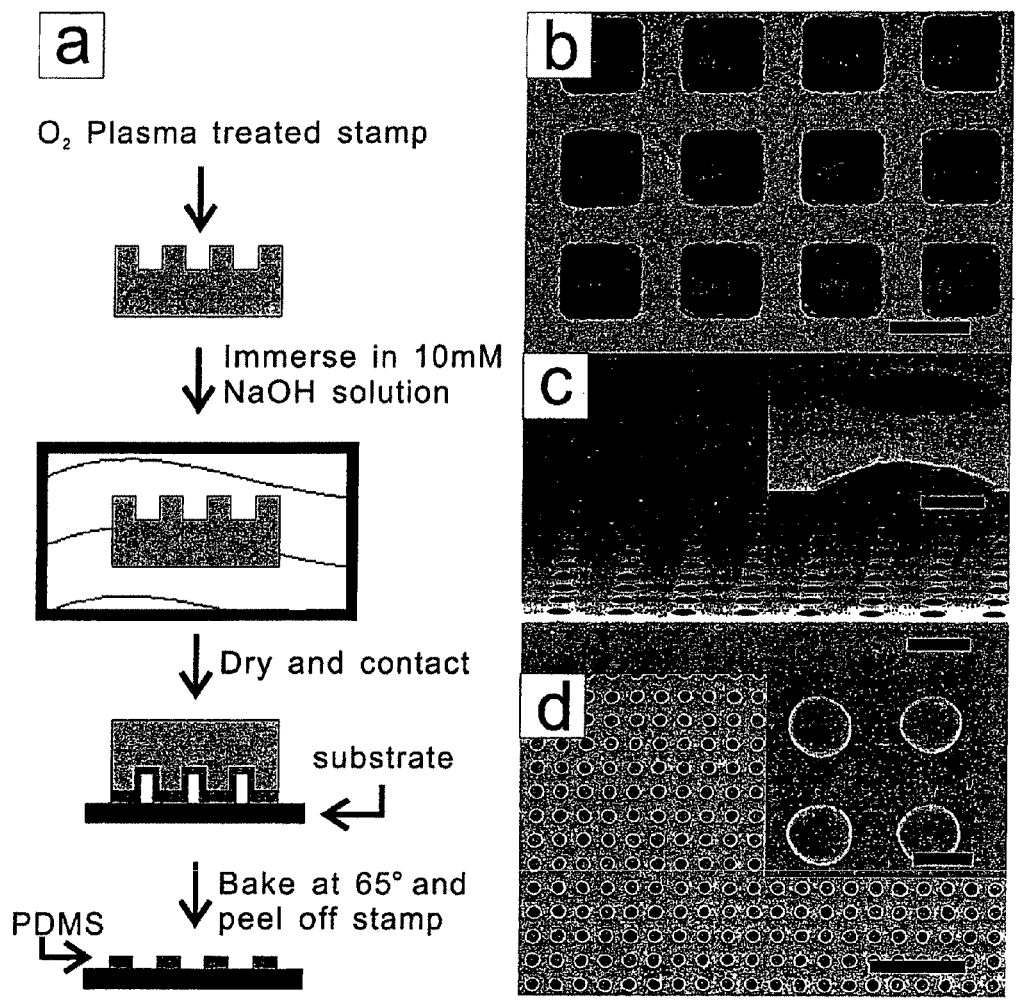
FIG. 6a shows a schematic illustration of a contact printing procedure according to an embodiment of the present invention utilizing a PDMS stamp and an NaOH activation step.
FIG. 6b shows an optical microscopic image of PDMS squares (scale bar: 70 μm)
FIG. 6c shows an SEM image of PDMS dots (scale bar: 4 μm), inset is its zoom-in image (scale bar: 500 nm)
FIG. 6d shows an SEM image of PDMS dots (scale bar: 2 μm), inset is a zoom-in SEM image (scale bar: 250 nm)

The procedure to transfer print hydrophobic surfaces is shown in FIG. 6. NaOH is used to 'activate' the PDMS stamp.

Firstly, a patterned PDMS stamp is oxidized (30 s) in an $O_2$ plasma to render the surface hydrophilic. The hydrophilic PDMS stamp is then immersed in 10 mM NaOH(aq) for 1 hr, and after drying under $N_2$ brought into contact with a clean Si wafer or a hydrophilic, topographically patterned photoresist layer. This assembly is cured for 1 hr at 65° C. and then the PDMS stamp peeled off, leaving a PDMS pattern transferred onto the areas of contact. The transfer of PDMS is due to cohesive mechanical failure (CMF) since the alkali fusion reaction of $SiO_2$-containing materials leads to the formation of silicate species on the stamp surface, which crosslink with Si/$SiO_2$ surfaces and hydroxyl groups on oxidized polymer substrates.

FIGS. 6b to 6d show a series of optical and scanning electronic microscopic (SEM) images of PDMS patterns transferred onto Si wafers. The transfer efficiency reaches nearly 100% with high uniformity over large ($cm^2$) areas. Depending on the design of PDMS stamp, the feature size of transferred PDMS can be varied from 200 nm to 100 μm, without obvious differences in reproduction quality.

Figure 7:
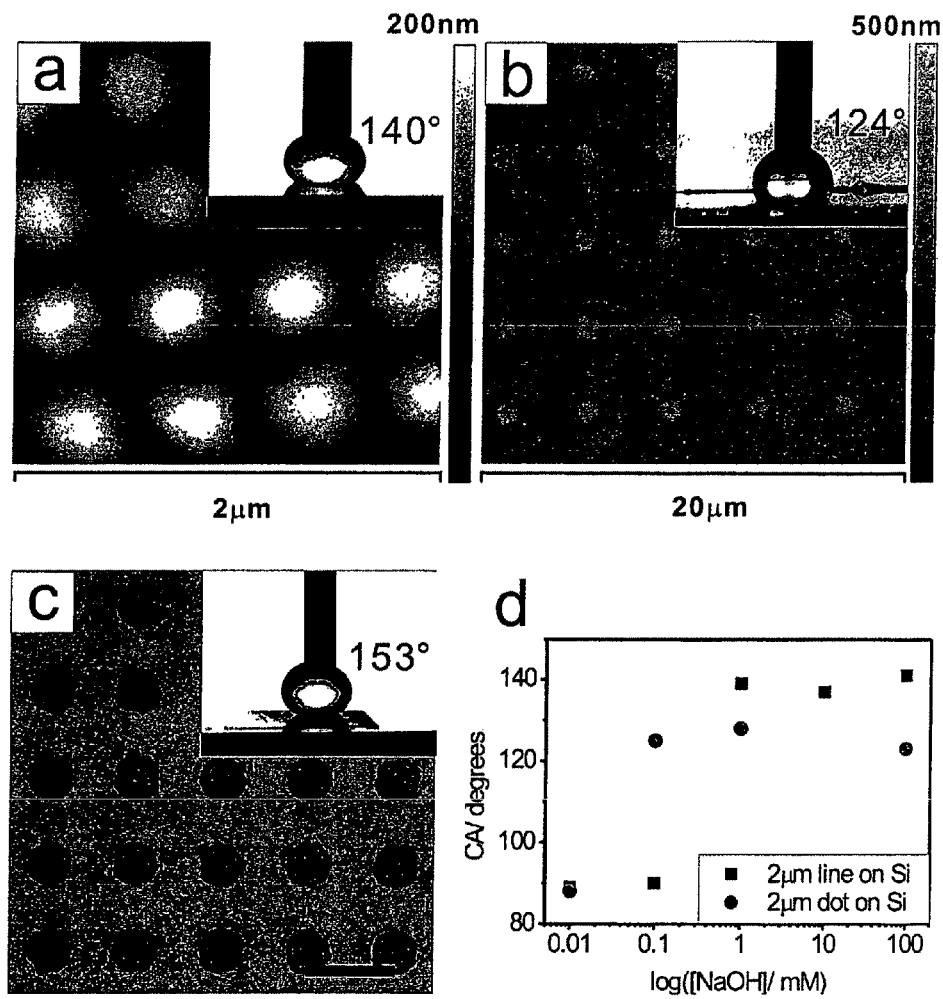
FIGS. 7a and 7b show AFM (Atomic Force Microscopy) topographic images of PDMS patterns, the insets are their corresponding advancing contact angle images, respectively.
FIG. 7c shows an optical microscopic image of PDMS dots (scale bar: 70 μm), the inset is its corresponding advancing contact angle image.
FIG. 7d shows advancing contact angle measurement results of PDMS patterns using different NaOH concentration. (■2 μm lines with 2 μm gap in between, ●2 μm posts with 2 μm gap in between)

Surfaces patterned at the (sub)micron level with hydrophobic (PDMS) features exhibit significantly increased contact angles. FIGS. 7a to 7c show AFM and optical microscopic images of the as-prepared PDMS patterns on Si/$SiO_2$ surfaces and their corresponding advancing contact angles. The original silicon wafer has a water contact angle (CA) of about 15°. After printing, the surface switches to hydrophobic with contact angles up to about 150° in the printed areas. The concentration of NaOH can be used to control the amount of PDMS transferred. As shown in FIG. 7d, for the 2×2 μm PDMS line pattern, the advancing CA of the printed area is only about 90° when using dilute NaOH (0.1 mM and 0.01 mM). AFM measurement shows that only traces of PDMS are transferred in the contact area because silicate species are unlikely to form well under such pH condition. When using more concentrated NaOH (1 mM to 100 mM), PDMS features with 100-300 nm height are transferred on to Si wafers and the CA increases to about 150°.

While not being bound by theory, it is believed that the dramatic increase of CA from 90° to 150° is due to the 'air trap' effect and the CA becomes stable once the aspect ratio of the PDMS features is above a certain value. The PDMS stamp suffers severe damage in 1 M NaOH and PDMS patterns cannot be uniformly transferred.

In accordance with embodiments of the present invention a printing technique is used to locally control surface wettability. Since high energy activation of substrates, such as UVO exposure, is not required, the technique has obvious advantages for patterning a wide range of substrates, including 'soft' surfaces like polymers.

Figure 8:
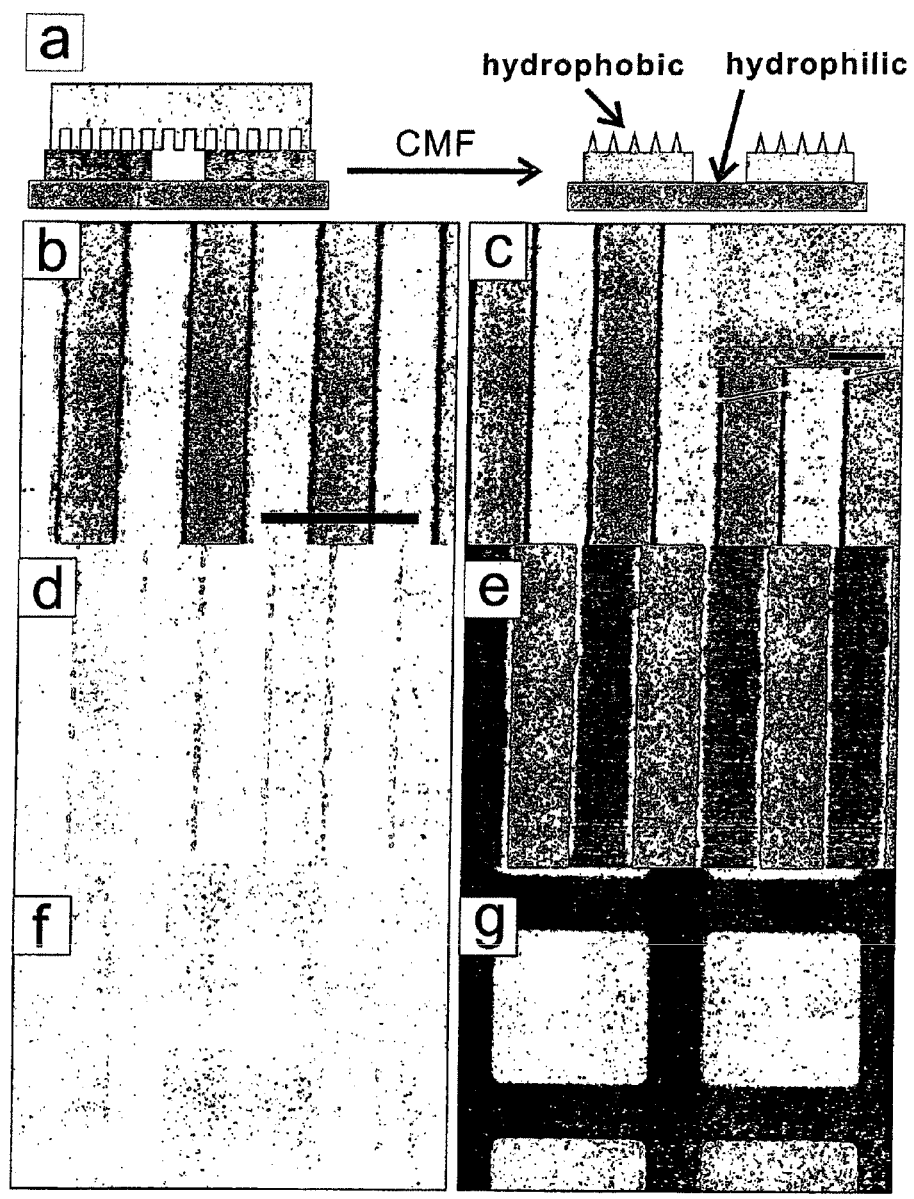
FIG. 8a shows a scheme for transferring a PDMS pattern onto a bank structure.
FIG. 8b shows bank lines made by photolithography (scale bar: 150 μm, applicable to FIGS. 8c-g.
FIG. 8c shows printed PDMS on the bank lines of FIG. 8b, the inset shows the zoom-in image on the PDMS pattern area (scale bar 150 em)
FIG. 8d shows fluorescent solution treated bank lines of FIG. 8b (previously treated with $O_2$ plasma)
FIG. 8e shows fluorescent solution treated bank lines of FIG. 8c.
FIG. 8f shows fluorescent solution treated microwells (previously treated with $O_2$ plasma)
FIG. 8g shows fluorescent solution treated microwells with additional PDMS patterns.

One key result is the formation of hydrophobic patterns on top of lithographically prepared patterns in photoresist for locally controlling the wettability, without the need for further lithography or chemical deposition steps. Such a technique is very important in, for example, display fabrication where polymers are inkjet printed onto pre-patterned surfaces. The spilling of ink onto the banks of photoresist presents a formidable impediment for the large-scale application of inkjet printing of polymer electronic devices. Ideally, the bottom of the wells should be hydrophilic while the top of the photoresist structures should be hydrophobic to prevent any wetting beyond the lithographically prepared features. As shown in FIG. 8a, a PDMS pattern has been transferred onto the top of oxidized SU8 microchannels (SU8 is a commercially available photoresist from Micro Chem Corp (MCC).

FIGS. 8b and 8c show the SU8 pattern before and after transfer printing 1.7 μm PDMS lines with a 4 μm period perpendicular to the direction of SU8 lines. Since only the resist banks are in contact with the PDMS stamp, the trenches remain unpatterned and hence hydrophilic. The ability to control wetting of microchannels by this 2-layer structure was demonstrated by dip-coating the sample with a fluorescent solution (Oregon Green 488, Molecular Probes) and imaging with fluorescent microscope. As shown in FIG. 8d, without the additional PDMS pattern, the fluorescent solution wet the entire surface. In contrast, FIG. 8e shows that the fluorescent solution only wet hydrophilic trenches of the 2-layer sample and de-wet on SU8 with additional PDMS structure. Similar results can be found in SU8 microwells in which the top was patterned with PDMS, leaving the wells unpatterned. Again the fluorescent solution wet the entire surface of SU8 treated with $O_2$ plasma (FIG. 8f) but only wet the hydrophilic well bottom of the 2-layer sample (FIG. 8g).

This application discloses a new PDMS stamping-based patterning strategy which utilizes NaOH to facilitate the irreversible binding between PDMS stamp and substrates and subsequent CMF (Cohesive Mechanical Failure) to transfer the PDMS patterns. The flexibility of the approach has been demonstrated by printing on different substrates. Printing various PDMS geometries allows to locally change the wettability of topographically structured surfaces. The flexibility of the method is further demonstrated by creating PDMS architectures on patterned SU8 photoresist, leading to differential wetting and dewetting properties in microchannels/microwells and on the PDMS transferred area, respectively.
Preparation of Substrates, Solutions and PDMS Stamp.

Si <100> and glass slide were ultrasonically cleaned in sequential acetone, ethanol and Mili-Q water for 5 minutes respectively before use. Gold substrate was prepared by thermal evaporation of 10 nm Cr plus 140 nm Au onto Si <100>. The evaporating speed was 0.1 nm/s and the chamber vacuum was kept $10^{-6}$ Pa during evaporation. Then gold film was decorated with 11-mercapto-1-1dodecanol (MDO) monolayer by soaking in ethanolic solution for 4 hr, followed by thoroughly rinsing with fresh ethanol and drying with $N_2$. Fluorescence solution was prepared by dissolving Oregon Green 488 into pH=10 basic solution. PDMS stamp was prepared as follows: prepolymer Sylgard 184 and its curing agent were mixed in a ratio of 10:1 and then cast on a photoresist master patterned by photolithography. After cured at 65° for 24 h, the PDMS stamp was peeled off from the master. SU8 (2015) patterns were made by photolithography following the supplier's recommended processes. The preparation of poly(N-isopropylacrylamide) (PNIPAM) brushes and poly([2-{methacryloyloxy}ethyl]trimethylammonium chloride) (PMATEC) brushes follows the literature method described in Jones et al., *Adv. Mater.* 2002, 14, 1130 and Osborne et al., *Chem. Commum.* 2002, 17, 1838.

Mechanism of PDMS Transfer

Our approach utilizes NaOH to facilitate the irreversible binding between PDMS and substrates. We suppose the swelling of PDMS in presence of NaOH resembles the well-known alkali fusion reaction of $SiO_2$-containing materials (a thin layer of $SiO_2$ lies on the PDMS surface after $O_2$ plasma), being:

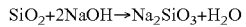

This reaction may lead to the formation of silicate species like $SiO_3^{2-}$, $SiO(OH)_3$ and $SiO_2(OH)_2^{2-}$ on the stamp surface upon contact with NaOH solution. Silicate species readily crosslink due to dehydration to generate polymeric species through the condensation reaction with the formation of Si—O—Si siloxane bonds:

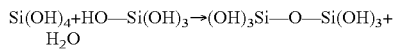

Figure 9:
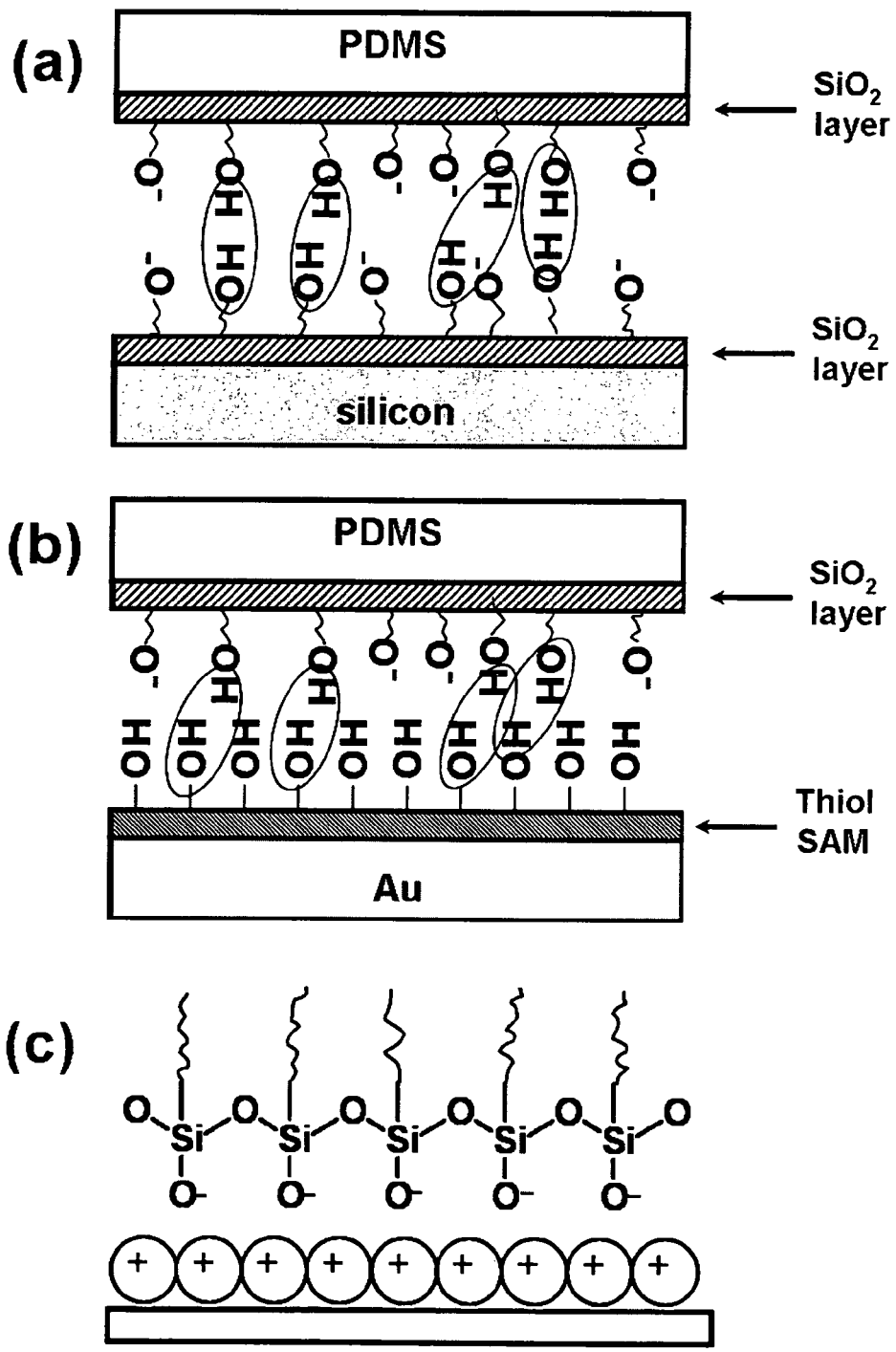
FIG. 9 shows a scheme indicating the PDMS transfer mechanism: (a) on Si/$SiO_2$ substrates; (b) on gold substrates; and (c) on cationic/positively-charged substrates.

A rigid silicate network can be built up by such a reaction. For $Si/SiO_2$ substrates such as Si <100> and glass, there exists a native oxide layer of a few nanometers thick on these surfaces. This oxide layer can participate in the crosslinking reaction leading to the anchoring of the PDMS structures (FIG. 9a). In other words, when NaOH solution flowed into the channels, the silicon oxide (turned into silicate) further crosslinks with the other silicate formed on the surface of PDMS. For gold and PCS, additional functional groups (e.g., hydroxyl group) are required in order to crosslink with the silicates generated on PDMS (FIG. 9b). Heating is required to provide sufficient energy. In the case of brushes with cationic/positively-charged moieties PNIAM and PMETAC, FIG. 9c), electrostatic immobilization is the route for anchoring the elastomeric structures. The interaction between the crosslinked silicates and the positively-charged moieties provides a robust and stable linkage between the PDMS features and the substrates.

Figure 10:
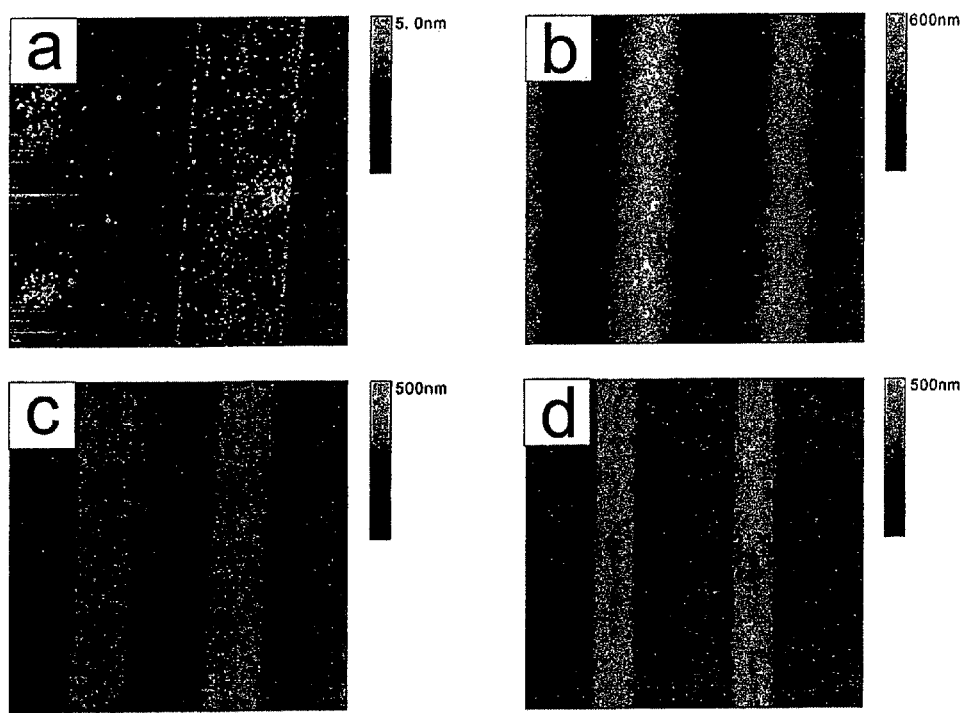
FIG. 10 shows AFM topographic images of PDMS lines on Si <100>, scan size 10×10 μm: (a) using 0.1 mM NaOH; (b) using 1 mM NaOH; (c) using 10 mM NaOH; and (d) using 100 mM NaOH.
Figure 11:
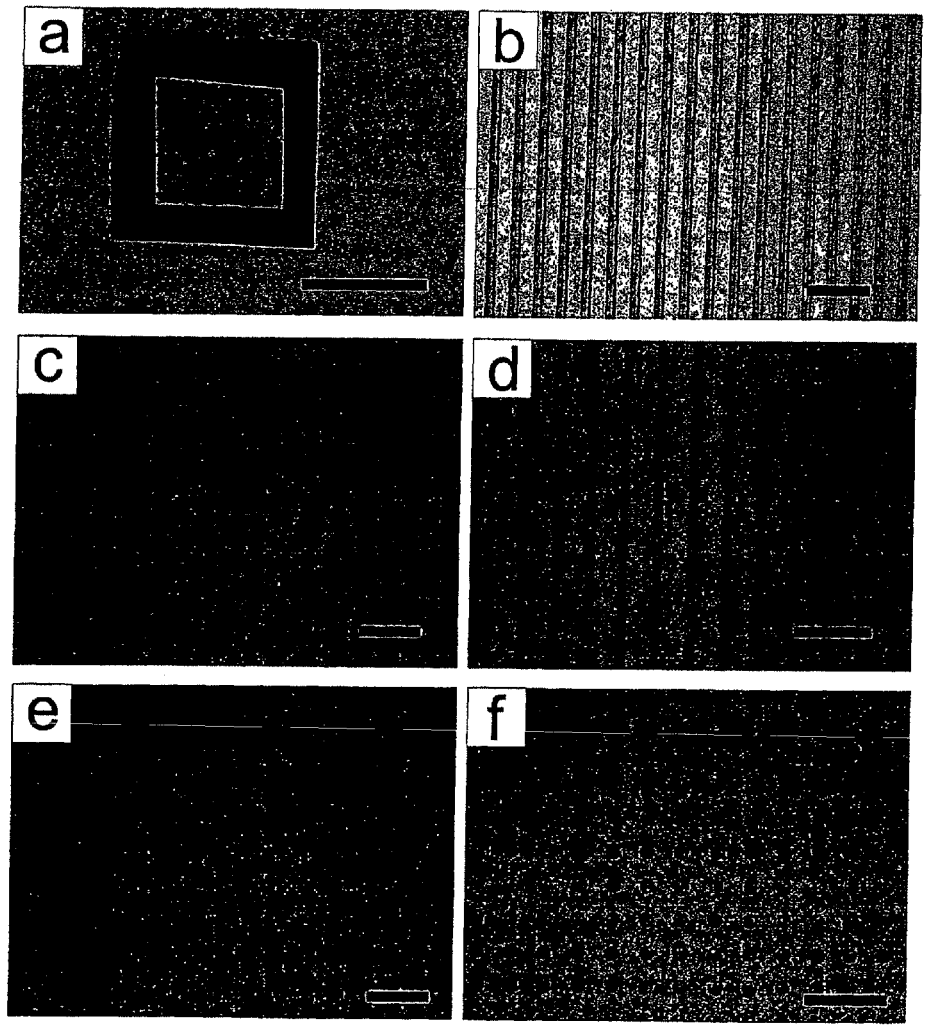
FIG. 11a shows a digital camera image of large area PDMS pattern on Si <100> (scale bar: 1 cm)
FIGS. 11b to 11f show optical microscopic image of PDMS pattern on: (b) glass (scale bar: 10 μm); (c) 11-mercapto-1-1dodecanol (MDO) treated gold (scale bar: 15 em); (d) polycarbonate sheet (scale bar: 15 μm), previously treated with $O_2$ plasma; (e) poly(N-isopropylacrylamide) (PNIPAM) brushes on gold (scale bar: 10 μm), no pre-treatment of the PNIPAM brushes needed; and (f) poly([2-{methacryloyloxy}ethyl]trimethylammonium chloride) (PMETAC) brushes on Si <100> (scale bar: 10 μm), no pre-treatment of the PNIPAM brushes needed.

FIG. 10 shows PMDS line AFM topography tinder different NaOH concentrations. In particular, FIG. 10 shows AFM topographic images of PDMS lines on Si <100>, scan size 10×10 μm: (a) using 0.1 mM NaOH; (b) using 1 mM NaOH; (c) using 10 mM NaOH; and (d) using 100 mM NaOH;

FIG. 11 shows PDMS patterns on various substrates. In particular, FIG. 11a shows a digital camera image of large area PDMS pattern on Si <100> (scale bar: 1 cm). FIGS. 11b to 11f show optical microscopic image of PDMS pattern on: (b) glass (scale bar: 10 μm); (c) MDO treated gold (scale bar: 15 μm); (d) polycarbonate sheet (scale bar: 15 μm), previously treated with $O_2$ plasma; (e) PNIPAM brushes on gold (scale bar: 10 μm), no pre-treatment of the PNIPAM brushes needed; and (f) PMETAC brushes on Si <100> (scale bar: 10 μm), no pre-treatment of the PNIPAM brushes needed.

Figure 1:
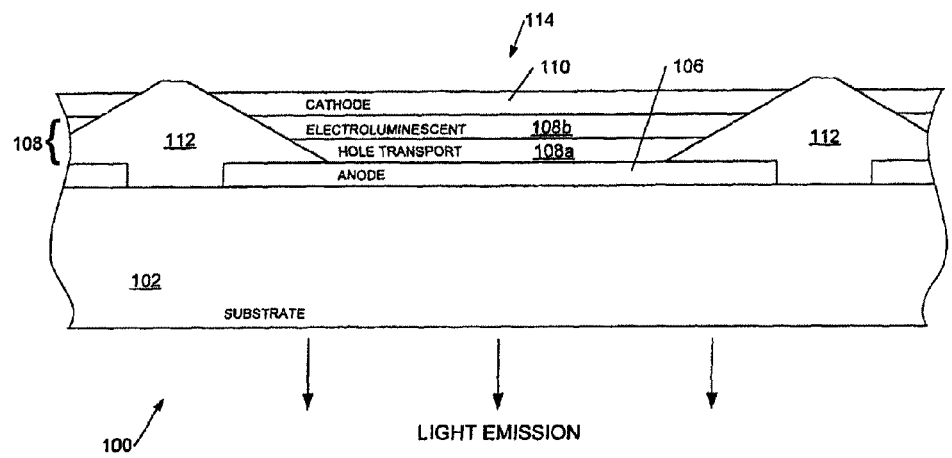
FIG. 1 shows a vertical cross section through an example of an OLED device.
Figure 2:
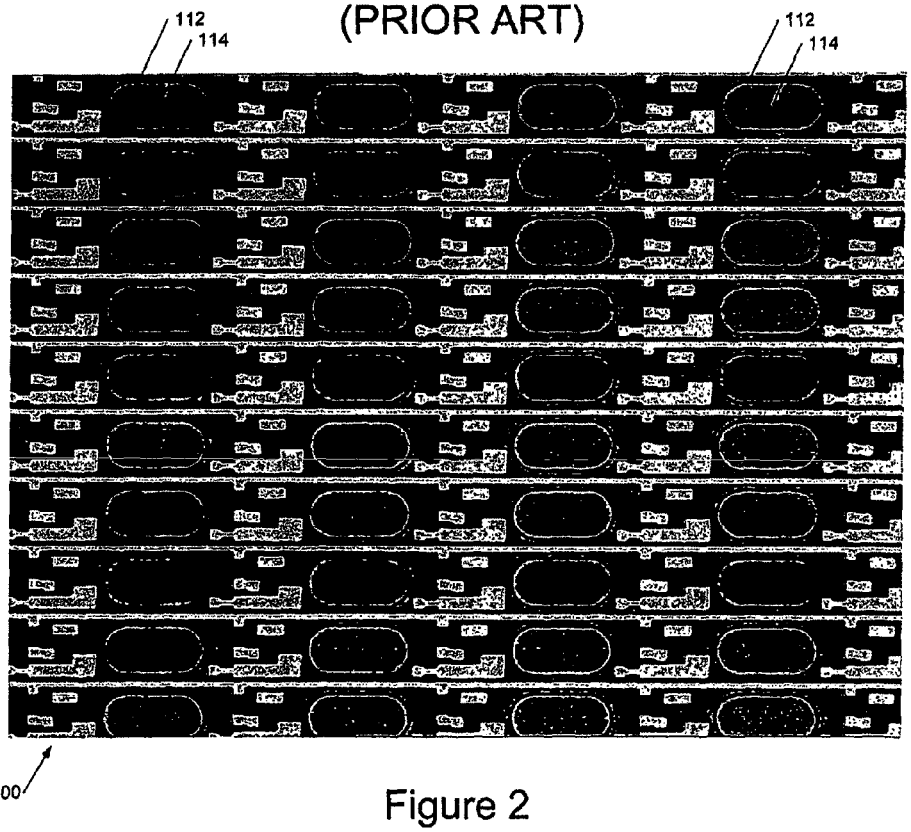
FIG. 2 shows a view from above of a portion of a three colour pixelated OLED display.
Figure 3A:
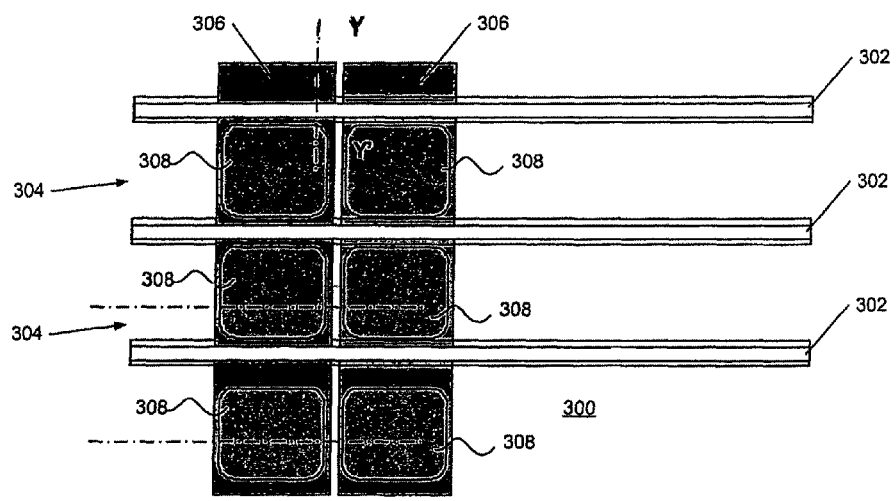
FIGS. 3a and 3b show a view from above and a cross-sectional view respectively of a passive matrix OLED display.
Figure 3B:
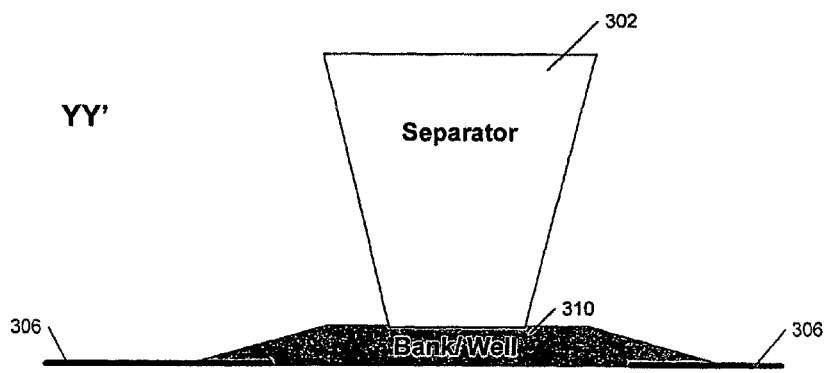
Figure 4A:
FIGS. 4a and 4b show a simplified cross section of a well of an OLED display substrate filled with, respectively, dissolved material, and dry material.
Figure 4B:
Figure 5A:
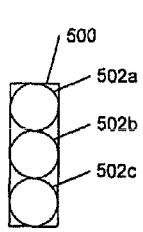
FIGS. 5a and 5b show examples of filling a small pixel and a large pixel respectively with droplets of dissolved OLED material.
Figure 5B:
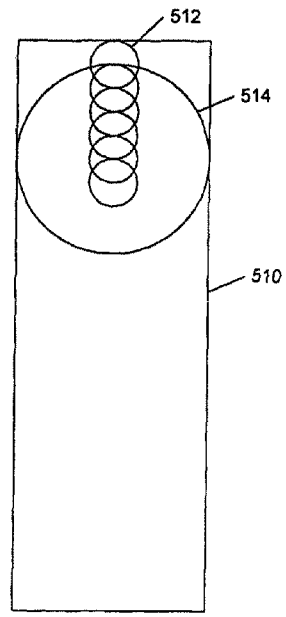
Figure 12:
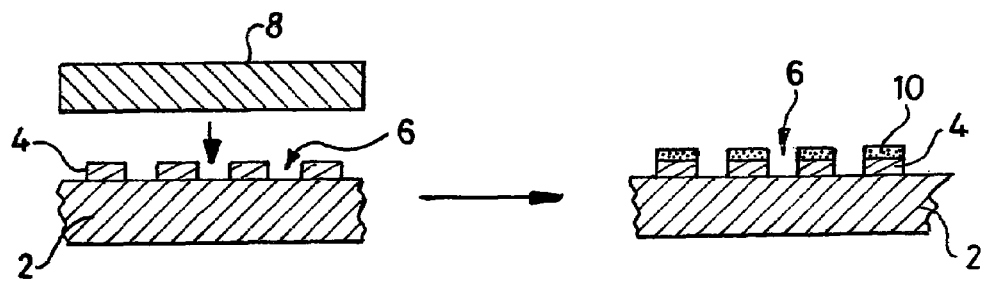
FIG. 12 illustrates a process for manufacturing an electrical device in accordance with an embodiment of the present invention.

FIG. 12 illustrates a process for manufacturing an electrical device in accordance with an embodiment of the present invention. A substrate 2 comprises a bank structure 4 defining a plurality wells 6. A stamp 8 is brought into contact with a distal surface of the bank structure 4 wherein the wettability of the distal surface of the bank structure 4 is decreased by transferring a layer of material 10 from stamp to the distal surface of the bank structure 4. A liquid comprising an electrically active material is subsequently deposited into the wells. Such a process can be used to manufacture a light-emissive device as illustrated in FIG. 1.

Figure 13:
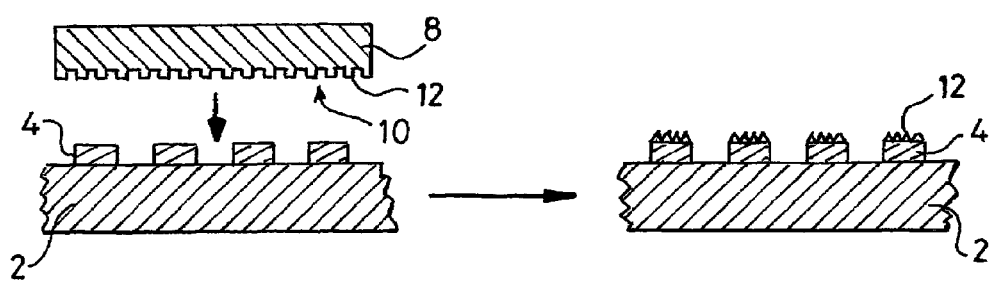
FIG. 13 illustrates a process for manufacturing an electrical device in accordance with another embodiment of the present invention.

FIG. 13 illustrates a preferred variant of the process illustrated in FIG. 12. The stamp 8 is provided with a roughened surface 10 comprising a plurality of projections 12 which are transferred to the distal surface of the bank structure 4 during the contacting step.

Figure 14:
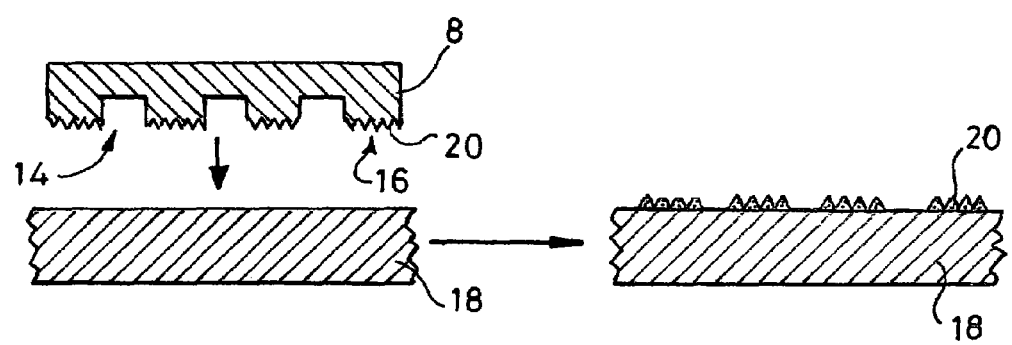
FIG. 14 illustrates a process for manufacturing an electrical device in accordance with another embodiment of the present invention.

FIG. 14 shows a further embodiment in which the stamp 8 comprises a bank structure 14, a distal surface of the bank structure comprising a roughened surface 16 comprising a plurality of projections 20. This stamp 8 can be used for contact printing onto a substrate 18 which does not comprise a bank structure. The projections 20 are transferred to the substrate on contacting with the stamp and form a pattern of low-wettability roughened areas. A liquid comprising an electrically active material is subsequently deposited between the low-wettability roughened areas.

While this invention has been particularly shown and described with reference to preferred embodiments, it will be understood to those skilled in the art that various changes in form and detail may be made without departing from the scope of the invention as defined by the appendant claims.

The invention claimed is:

1. A process for manufacturing an electrical device, the process comprising the steps:
   providing a substrate;
   activating a stamp with a base or a fluoride;
   bringing the activated stamp into contact with the substrate whereby areas of the substrate contacted by the stamp have decreased wettability; and
   depositing a liquid comprising an electrically active material over areas of the substrate located between the areas of decreased wettability.

2. A process according to claim 1, wherein the areas of the substrate located between the areas of decreased wettability define a 2-dimensional array of pixels.

3. A process according to claim 1, wherein the substrate comprises a bank structure defining one or more wells and the step of bringing the stamp into contact with the substrate comprises bringing the stamp into contact with a distal surface of the bank structure whereby the wettability of the distal surface of the bank structure is decreased; the liquid comprising the electrically active material being deposited into the one or more wells.

4. A process according to claim 1, wherein the stamp comprises a bank structure defining one or more wells, and the step of bringing the stamp into contact with the substrate comprises bringing a distal surface of the bank structure into contact with the substrate whereby areas of the substrate contacted by the distal surface of the bank structure have decreased wettability, the liquid comprising the electrically active material being deposited over the substrate between the areas of decreased wettability.

5. A process according to claim 3, wherein the bank structure is formed by a lithographic process.

6. A process according to claim 3, wherein the bank structure has a height in the range 0.1 to 5 µm.

7. A process according to claim 3, wherein the distance between the wells is in the range 20 to 100 µm.

8. A process according to claim 3, wherein and the wells are approximately 100 to 500 µm wide.

9. A process according to claim 1, wherein the substrate comprises a first electrode layer.

10. A process according to claim 1, further comprising the step of depositing a second electrode layer over the electrically active material.

11. A process according to claim 1, wherein the electrically active material is an organic material.

12. A process according to claim 11, wherein the organic material comprises one or more of a polymer, an oligomer, a dendrimer and a low molecular weight material.

13. A process according to claim 1, wherein the electrically active material comprise a light-emissive material.

14. A process according to claim 1, wherein the electrically active material comprises a semi-conductive material.

15. A process according to claim 1, wherein the electrically active material comprises a conductive material.

16. A process according to claim 1, wherein the depositing step comprises depositing a first layer of electrically active material and depositing a second layer of electrically active material thereover.

17. A process according to claim 16, wherein the first layer of electrically active material comprises a charge transporting material and the second layer of electrically active material comprises a light-emissive material.

18. A process according to claim 17, wherein a layer of charge injecting material is deposited prior to deposition of the charge transporting material.

19. A process according to claim 1, wherein the electrically active material is deposited by inkjet printing.

20. A process according to claim 1, wherein the liquid comprising the electrically active material is deposited such that it extends over the areas of the substrate having decreased wettability and on drying the electrically active material flows off said areas due to the decreased wettability of said areas.

21. A process according to claim 1, wherein the chemical constitution of the areas of the substrate contacted by the stamp is altered during the contacting step.

22. A process according to claim 21, wherein a film of material is transferred from the stamp to the areas of the substrate contacted by the stamp.

23. A process according to claim 1, wherein the step of contacting the substrate with the stamp causes the areas of the substrate contacted by the stamp to have a roughened surface.

24. A process according to claim 23, wherein the roughened surface is formed by transferring material from the stamp to the areas of the substrate contacted by the stamp.

25. A process according to claim 23, wherein the roughened surface comprises a plurality of microscopic or nano-scale projections.

26. A process according to claim 25, wherein the projections having a height in the range 10 to 500 nm.

27. A process according to claim 25, wherein the projections have a width in the range 0.1 to 10 µm.

28. A process according to claim 25, wherein the distance between the projections is in the range 0.1 to 10 µm.

29. A process according to claim 1, wherein a contact angle between the liquid comprising the electrically active material and the areas of decreased wettability is above 120°.

30. A process according to claim 1, wherein the stamp is made of an elastomeric material.

31. A process according to claim 30, wherein the stamp comprises Poly Dimethyl Siloxane (PDMS).

32. A process according to claim 1, wherein the stamp is activated with a hydroxide.

33. A process according to claim 1, wherein the concentration of the base is in the range 1 mM to 100 mM.

34. A process according to claim 1, wherein after bringing the stamp into contact with the substrate, a baking step is performed prior to removal of the stamp.

35. A process according to claim 34, wherein the baking step is performed at a temperature in the range 40 to 90°.

36. A process according to claim 1, wherein the stamp is treated with $O_2$ plasma.

37. A process according to claim 4, wherein the bank structure is formed by a lithographic process.

38. A process according to claim 4, wherein the bank structure has a height in the range 0.1 to 5 µm.

39. A process according to claim 4, wherein the distance between the wells is in the range 20 to 100 µm.

40. A process according to claim 4, wherein and the wells are approximately 100 to 500 µm wide.

41. A process according to claim 3, wherein the bank structure has a height in the range 0.5 to 3 µm.

42. A process according to claim 3, wherein the bank structure has a height in the range 1 to 1.5 µm.

43. A process according to claim 25, wherein the projections having a height in the range 50 to 500 nm.

44. A process according to claim 25, wherein the projections having a height in the range 100 to 300 nm.

45. A process according to claim 25, wherein the projections have a width in the range 0.5 to 5 µm.

46. A process according to claim 25, wherein the projections have a width in the range 1 to 2 µm.

47. A process according to claim 25, wherein the distance between the projections is in the range 0.5 to 5 µm.

48. A process according to claim 25, wherein the distance between the projections is in the range 1 to 2 µm.

49. A process according to claim 1, wherein a contact angle between the liquid comprising the electrically active material and the areas of decreased wettability is above 130°.

50. A process according to claim 1, wherein a contact angle between the liquid comprising the electrically active material and the areas of decreased wettability is above 140°.

51. A process according to claim 1, wherein a contact angle between the liquid comprising the electrically active material and the areas of decreased wettability is around 150° or higher.

52. A process according to claim 34, wherein the baking step is performed at a temperature in the range 50 to 80°.

53. A process according to claim 34, wherein the baking step is performed at a temperature about 65°.

54. A process according to claim 4, wherein the bank structure has a height in the range 0.5 to 3 µm.

55. A process according to claim 4, wherein the bank structure has a height in the range 1 to 1.5 µm.

* * * * *

UNITED STATES PATENT AND TRADEMARK OFFICE
CERTIFICATE OF CORRECTION

PATENT NO. : 8,067,265 B2  
APPLICATION NO. : 12/296931  
DATED : November 29, 2011  
INVENTOR(S) : Zi-jian Zheng et al.

Page 1 of 1

It is certified that error appears in the above-identified patent and that said Letters Patent is hereby corrected as shown below:

Title page, item [54]
IN THE TITLE:

Replace "MANUFATURING"

With -- MANUFACTURING --

In column 1, line 2: Replace "MANUFATURING"

With -- MANUFACTURING --

In column 20, line 27: Replace "$SiO(OH)_3$"

With -- $SiO(OH)_3^-$ --

Signed and Sealed this
Twenty-ninth Day of May, 2012

David J. Kappos
*Director of the United States Patent and Trademark Office*